(12) United States Patent
Byun et al.

(10) Patent No.: US 7,643,598 B2
(45) Date of Patent: Jan. 5, 2010

(54) FREQUENCY LOCK DETECTOR

(75) Inventors: Sang-Jin Byun, Daejon (KR);
Hyun-Kyu Yu, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 560 days.

(21) Appl. No.: 11/204,957

(22) Filed: Aug. 16, 2005

(65) Prior Publication Data

US 2006/0087352 A1  Apr. 27, 2006

(30) Foreign Application Priority Data

Oct. 26, 2004  (KR) ............... 10-2004-0085772

(51) Int. Cl.
*H04L 7/00* (2006.01)
(52) U.S. Cl. ..................... 375/371; 327/12
(58) Field of Classification Search ......... 375/354–355, 375/373, 375, 376, 371; 327/12
See application file for complete search history.

(56) References Cited

U.S. PATENT DOCUMENTS

| 4,817,160 | A * | 3/1989 | De Koning et al. | 381/83 |
| 2005/0135526 | A1* | 6/2005 | Miller et al. | 375/354 |
| 2008/0089459 | A1* | 4/2008 | Vlasenko et al. | 375/376 |

FOREIGN PATENT DOCUMENTS

| JP | 02296411 | 12/1990 |
| JP | 04-260238 | 9/1992 |
| JP | 2000249732 | 9/2000 |
| JP | 2000269797 | 9/2000 |
| KR | 10 0175395 | 5/1997 |
| KR | 10 0246326 | 12/1999 |
| KR | 10 0271636 | 8/2000 |
| KR | 2003 0058391 | 7/2003 |

* cited by examiner

*Primary Examiner*—Chieh M. Fan
*Assistant Examiner*—Freshteh N. Aghdam
(74) *Attorney, Agent, or Firm*—Ladas & Parry LLP

(57) ABSTRACT

Provided is a frequency lock detector which includes one counter and a clock number difference detector for detecting a clock number difference while not increasing complexity according to the counting number N to compare the frequencies of two clock signals whose phases are not synchronous to each other and determine whether the difference between the frequencies of the two signals is within a desired frequency accuracy. The frequency lock detector includes: a counter for counting the number of clocks of a reference clock signal inputted from outside; a clock number difference detector for detecting a difference between the clock number of the reference clock signal and the clock number of a recovered clock signal whose phase is not synchronous to the phase of the reference clock signal; and a lock determiner for determining a frequency lock based on result values of the counter and the clock number difference detector.

7 Claims, 5 Drawing Sheets

FREQUENCY LOCK DETECTOR

FIELD OF THE INVENTION

The present invention relates to a frequency lock detector; and, more particularly, to a frequency lock detector for comparing the frequency of a reference clock signal transmitted from the outside with the frequency of a clock signal recovered from received serial data in a clock data recovery circuit and determining whether the difference between the frequencies of the two signals is within a desired frequency accuracy. The phase synchronization of the reference clock signal and the recovered clock signal is not necessary in this invention.

DESCRIPTION OF RELATED ART

Korean Patent Publication No. 10-2003-0058391 published on Jul. 7, 2003, and entitled "Frequency comparator having desired frequency accuracy," discloses a technology precisely comparing the frequency of a reference clock signal with the frequency of a recovered clock signal whose phase is not synchronized with that of the reference clock signal. The conventional technology is directed to a frequency comparator having a desired frequency accuracy. The frequency comparator can compare frequencies of a reference signal and a target signal even though their phases are not synchronized by counting the number of clocks of the reference signal and a target signal to be compared by using two counters which are programmed with a predetermined value by a user, and comparing the counted numbers at a time point when the counting is completed.

However, the conventional technology has a problem that the complexity of the two counters is increased, because the counting numbers of the counters are raised when a desired frequency accuracy level is increased.

The conventional technology will be described more in detail with reference to FIGS. 1 and 2.

FIG. 1 is a block diagram showing a conventional frequency lock detector using two counters. As shown, the conventional frequency lock detector using two counters includes two counters 101 and 102 and a lock determiner 103 for determining whether the difference between the frequencies of the two signals is within a desired frequency accuracy based on output values m and n of the counters 101 and 102.

Among the two counters 101 and 102, a first counter 101 counts the number of clocks of the reference clock signal as much as a predetermined count number N, and a second counter 102 counts the number of clocks of the recovered clock signal as much as a predetermined count number N. Herein, whichever of the first counter 101 and the second counter 102 reaches the predetermined count number N first, the lock determiner 103 compares the difference between the counting numbers m and n of the two counters 101 and 102 with the predetermined value corresponding to the desired frequency accuracy, determines whether the difference between the frequencies of the reference clock signal and the recovered clock signal is within the desired frequency accuracy, and outputs a lock signal.

To be specific, when the desired frequency accuracy is 30%, which is 300,000 ppm, the predetermined counting numbers N of the first and second counters 101 and 102 are 10, respectively. The frequency lock detector can be designed by setting up the difference between the predetermined counting numbers corresponding to the desired frequency accuracy.

Herein, when the frequency of the reference clock signal is 20% higher than that of the recovered clock signal and the first counter 101 has counted 10 times, the second counter 102 counts 8 times. The difference between the counting numbers of the two counters 101 and 102 is two times and, if the desired frequency accuracy is 30%, the difference in the predetermined counting numbers is smaller than 3 times. Thus, the lock determiner 103 outputs a high signal, i.e., 1, as a lock signal. Likewise, when the frequency of the reference signal is 20% lower than that of the recovered clock signal and the second counter 102 has counted 10 times, the first counter 101 counts 8 times. Since the difference in the counting numbers of the two counters 101 and 102 is two times, which is smaller than the difference in the predetermined counting number when the predetermined counting number is 30%, i.e., three times, the lock determiner 103 outputs 1 as a lock signal.

On the contrary, when the frequency of the reference clock signal is 40% higher than that of the recovered clock signal and the first counter 101 has counted 10 time, the second counter 102 counts 6 times. Herein, the difference between the counting numbers of the two counter 101 and 102 is 4 times, which is larger than the difference between the predetermined counting numbers when the desired frequency accuracy is 30%, i.e., three times, the lock determined 103 outputs a low signal, which is 0, as a lock signal.

FIG. 2 is a timing diagram describing a waveform of an essential part of the conventional frequency lock detector of FIG. 1. The drawing presents a lock detector when the desired frequency accuracy is 30% to help clear understanding.

As described in FIG. 1, whichever counts 10 times first between the first counter 101 and the second counter 102, if the ten times are counted, the reset signal is enabled. Then, the lock determiner 103 compares the difference between the counting numbers of the two counters 101 and 102 with the predetermined counting number and outputs 1 as a lock signal.

To take a more specific and realistic example, if the desired frequency accuracy is very high such as 200 ppm just as in a clock data recovery circuit of a high-rate serial communication, the predetermined counting numbers N to be counted by the first and second counters 101 and 102 are 10,000, individually and the predetermined difference between the counting numbers N of the first and second counters 101 and 102 is two times. Herein, since the integration of the counter whose counting number N is 10,000 leads to increased complexity of hardware, e.g., $\log_2 N$, there is a problem that it becomes hard to integrate a counter as the desired frequency accuracy increases.

In short, the conventional frequency lock detector employing two counters for frequency lock detection counts the clock numbers of two clock signals outputted from the two counters individually and compares the counting numbers with each other. If the frequencies are to be compared with a high frequency accuracy, the size of the counters becomes large as the desired frequency accuracy increases. Therefore, there is a problem that it is difficult to integrate the frequency lock detector due to high circuit complexity and power consumption and wide area.

SUMMARY OF THE INVENTION

It is, therefore, an object of the present invention to provide a frequency lock detector that can be integrated easily by comparing frequencies of two clock signals whose phases are not synchronized with one counter and a clock number difference detector and determining a frequency lock, that is, whether the frequency accuracy is within a desired range.

It is another object of the present invention to provide a frequency lock detector that can be easily integrated by using one counter and a clock number difference detector capable of detecting the difference between the clock numbers while not increasing the complexity according to the counting number N, which is different from a conventional frequency lock detector employing two counters which increases complexity according to the counting number N when a desired frequency accuracy is high.

In accordance with an aspect of the present invention, there is provided a frequency lock detector, which includes: a counter for counting the number of clocks of a reference clock signal inputted from outside; a clock number difference detector for detecting a difference between the clock number of the reference clock signal and the clock number of a recovered clock signal whose phase is not synchronous to the phase of the reference clock signal; and a lock determiner for determining a frequency lock based on result values of the counter and the clock number difference detector.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter. Also, if it is considered that detailed description on prior art in connection with the present invention may blur the point of the invention, the description will not be provided herein. Hereinafter, preferred embodiments of the present invention will be described with reference to accompanying drawings.

Figure 1:
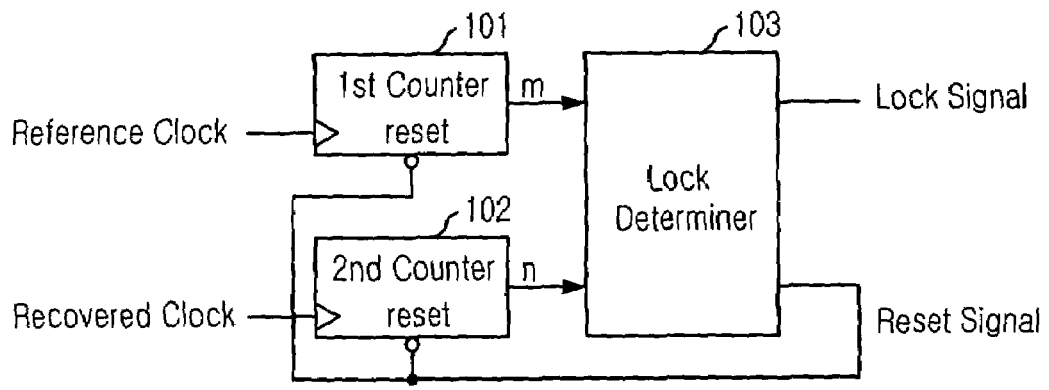
FIG. 1 is a block diagram showing a conventional frequency lock detector using two counters.
Figure 2:
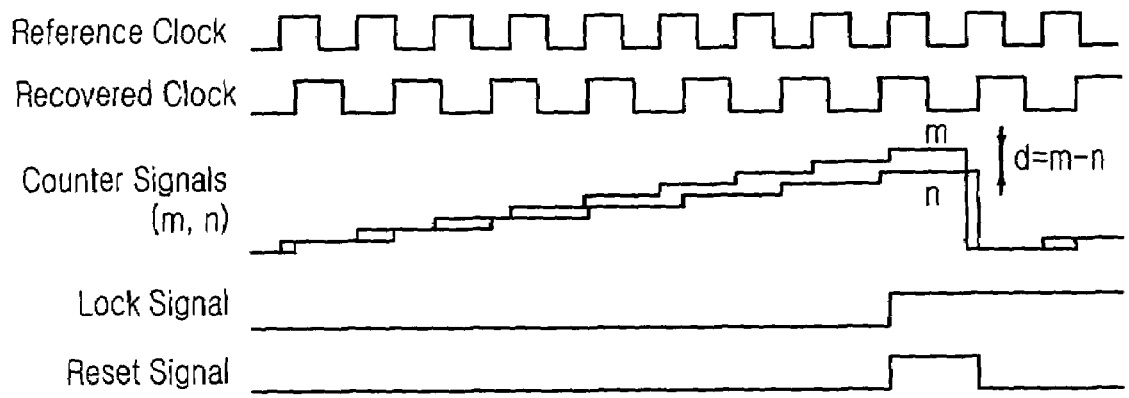
FIG. 2 is a timing diagram describing a waveform of an essential part of the conventional frequency lock detector of FIG. 1.
Figure 3:
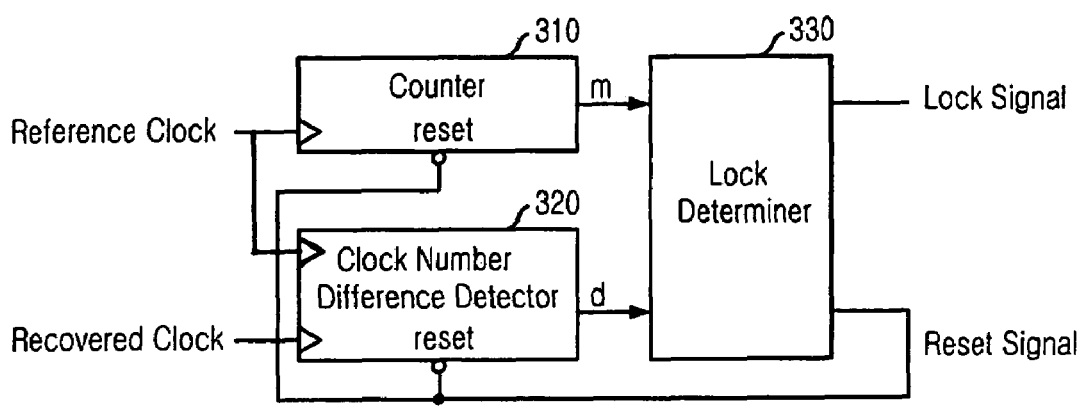
FIG. 3 is a block diagram illustrating a frequency lock detector using a counter and a clock number difference detector in accordance with an embodiment of the present invention.

FIG. 3 is a block diagram illustrating a frequency lock detector using a counter and a clock number difference detector in accordance with an embodiment of the present invention.

As shown in FIG. 3, the frequency lock detector employing one counter and one clock number difference detector includes a counter 310, a clock number difference detector 320, a lock determiner 330. The counter 310 receives a reference clock signal from the outside and counts the clock number of the reference clock signal. The clock number difference detector 320 detects the difference between the clock number of the reference clock signal and the clock number of a recovered clock signal. The lock determiner 330 determining a frequency lock based on output values of the counter 310 and the clock number difference detector 320.

Herein, the reference clock signal, which is transmitted from the outside, and the recovered clock signal, which is recovered from a received serial data, are not synchronous to each other in phase.

The counter 310 counts the clock number of the reference signal inputted from the outside in a predetermined counting number N to thereby output a result value m to the lock determiner 330, and it is reset upon a reset signal generated in the lock determiner 330 to perform counting from 1 again.

The clock number difference detector 320 detects the difference between the clock number of the reference clock signal transmitted from the outside and the clock number of the recovered clock signal and outputs a result value d to the lock determiner 330. The clock number difference detector 320 is reset based on a reset signal generated in the lock determiner 330.

The lock determiner 330 receives the result value m from the counter 310 and receives the result value d from the clock number difference detector 320. Herein, the lock determiner 330 generates a reset signal and outputs the reset signal to the counter 310 and the clock number difference detector 320 when the result value m outputted from the counter 310 becomes the predetermined counting number N or when the result value d is larger than a predetermined clock number difference K corresponding to a desired frequency accuracy before the result value m becomes the predetermined counting number N. The lock determiner 330 compares the clock number difference d between the reference clock signal and the recovered clock signal with the predetermined clock number difference K corresponding to the desired frequency accuracy when the result value m outputted from the counter 310 is the predetermined counting number N, determines whether the difference between the frequencies of the reference clock signal and the recovered clock signal is within the desired frequency accuracy, and outputs a lock signal.

Figure 4:
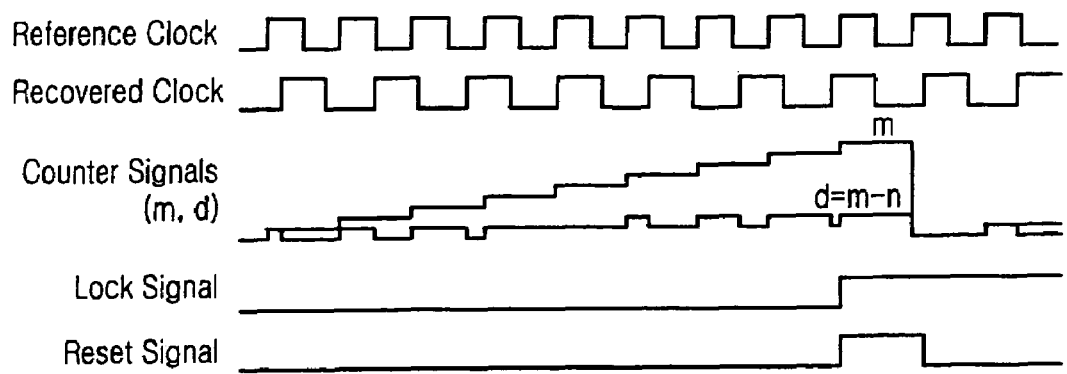
FIG. 4 is a timing diagram describing a waveform of an essential part of the frequency lock detector of FIG. 3.
Figure 7:
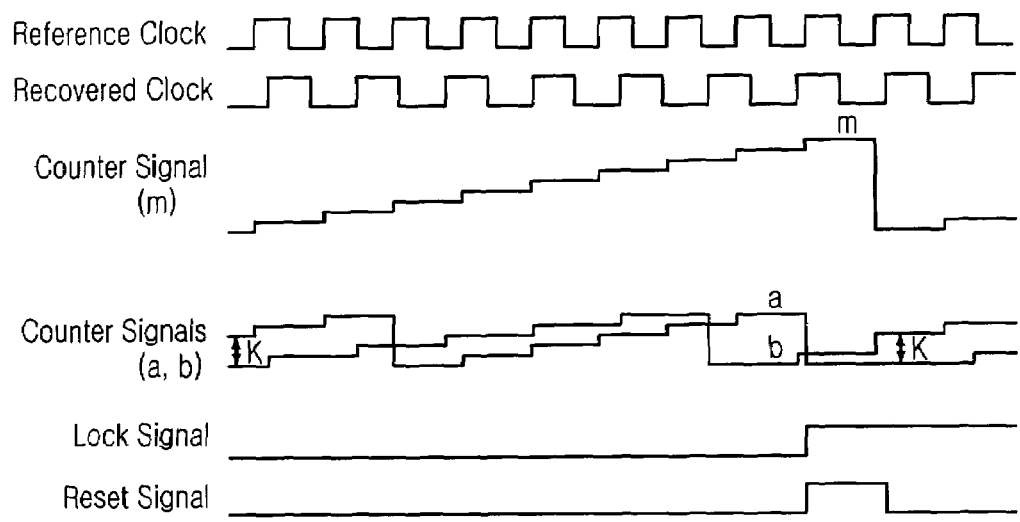
FIG. 7 is a timing diagram describing a waveform of an essential part of the frequency lock detector of FIG. 3 to which the clock number difference detector of FIG. 6 is applied.
Figure 9:
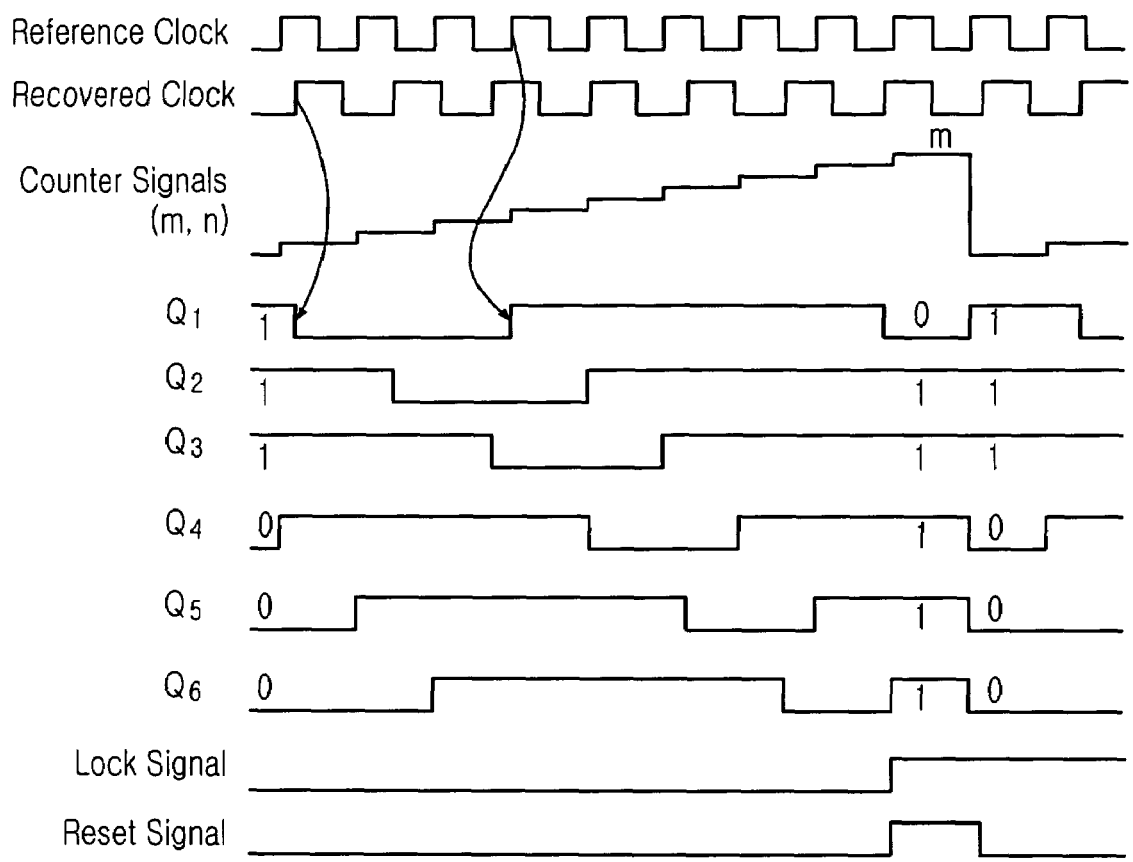
FIG. 9 is a timing diagram describing a waveform of an essential part of the frequency lock detector of FIG. 3 to which the clock number difference detector of FIG. 8 is applied.

To take a specific example, when the desired frequency accuracy is 30%, i.e., 300,000 ppm, and the frequency difference between the reference clock and the recovered clock is 20%, major waveforms are as shown in FIGS. 4, 7 and 9. Herein, the frequency lock detector can be designed to have a counting number N of 10 times in the counter 310 and the clock number difference K of 3 times for the desired frequency accuracy.

FIG. 4 is a timing diagram describing a waveform of an essential part of the frequency lock detector of FIG. 3.

As shown in FIG. 4, the counter signal m is counted up to N times, e.g., 10 times, according to a rising edge of the reference clock, and it can be counted again from 1 according to a reset signal generated in the lock determiner 330. Then, a clock number difference signal d indicates the difference between the clock number of the reference clock signal obtained by increasing the reference clock by 1 and the clock number of the recovered signal obtained by decreasing the recovered clock by 1.

Meanwhile, the lock determiner 330 generates a lock signal and a reset signal. Herein, the lock signal is 1 when the counter signal m is 10 and the clock number difference is not more than 3. FIG. 4 shows a case where the lock signal is 1, when the counter signal m is 10, the clock number difference d is 2. The reset signal is generated when the counter signal m is 10 or when the counter signal m is less than 10 but the clock number difference is more than 3. In other words, when the counter signal m is 10, the reset signal resets the counter 310 to perform the counting from 1 again. When the counter signal m is less than 10 and the absolute value of the clock number difference d is more than 3, it means that the frequency difference between two signals is out of the desired frequency accuracy, even through the counter 310 does not count up to 10. Therefore, the counter 310 is reset to perform the counting from 1 again.

If the desired frequency accuracy is very high, such as 200 ppm, the frequency lock detector can be designed to have a counting number N of 10,000 times in the counter 310 and a clock number difference K of 2 times based on an equation 1. Thus, although the hardware complexity of the counter 310 increases according to the determined counting number N just as $\log_2 N$, the predetermined clock number difference K can be maintained to be a small number regardless of the desired frequency accuracy.

$$\text{Desired frequency accuracy=predetermined clock number difference}(K)/\text{Predetermined counting number}(N) \qquad \text{Eq. 1}$$

Figure 5:
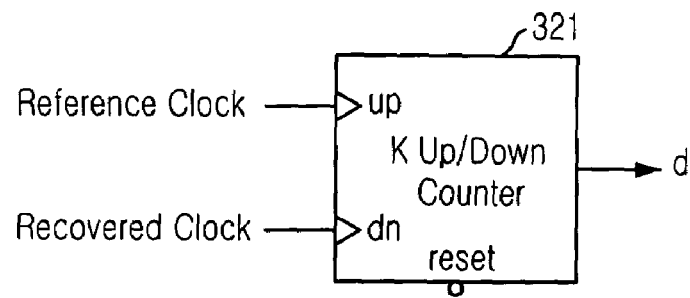
FIG. 5 is a block diagram showing the clock number difference detector of FIG. 3 in accordance with an embodiment of the present invention.
Figure 6:
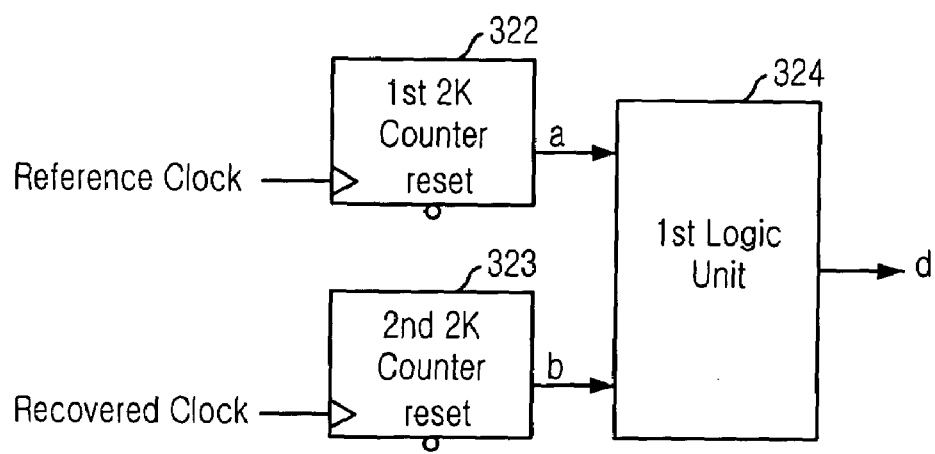
FIG. 6 is a block diagram showing the clock number difference detector of FIG. 3 in accordance with another embodiment of the present invention.
Figure 8:
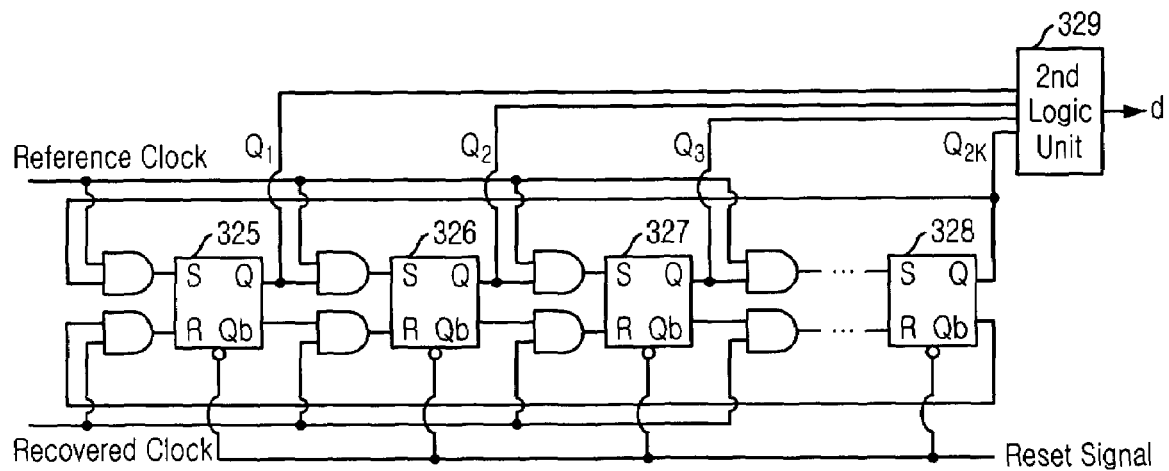
FIG. 8 is a schematic diagram illustrating the clock number difference detector of FIG. 3 in accordance with another embodiment of the present invention.

FIGS. 5, 6, and 8 show actual embodiments of the clock number difference detector 320 for detecting the difference between the clock number of the reference clock signal and the clock number of the recovered clock signal, individually.

FIG. 5 is a diagram showing the clock number difference detector of FIG. 3 in accordance with an embodiment of the present invention.

As illustrated in FIG. 5, the clock number difference detector 320 can be realized as a K up/down counter 321 that can receives a reference clock signal from the outside through an up terminal and a recovered clock signal through a down terminal and count from 0 to ±K. Herein, when the reference clock signal is used as an up signal and the recovered clock signal is used as a down signal, the major waveforms of the frequency lock detector is as described above with reference to FIG. 4.

FIG. 6 is a block diagram showing the clock number difference detector of FIG. 3 in accordance with another embodiment of the present invention.

As illustrated in FIG. 6, the clock number difference detector 320 includes a first 2K counter 322, a second 2K counter 323, and a first logic unit 324. The first 2K counter 322 counts a reference clock inputted from the outside from K to 2K and counts again from 1, i.e., in such a manner as K, K+1, ..., 2K, 1, 2, ..., K−1, and outputs a result value a to the first logic unit 324. The second 2K counter 323 counts the recovered clock signal from 1 to 2K and outputs a result value b to the first logic unit 324. The first logic unit 324 detects a difference between the result values a and b of the first and second 2K counters 322 and 323 and outputs the difference to the lock determiner 330.

Herein, the result values a and b of the first and second 2K counters 322 and 323 can be expressed as modulo operation shown in equations 2 and 3 below. To help understanding, 'equation 10≡3 (mod 7)' is an equation expressing that 10 and 3 has the same remainder when they are divided by 7.'

$$a \equiv K+m (\mod 2K) \qquad \text{Eq. 2}$$

$$b \equiv n (\mod 2K) \qquad \text{Eq. 3}$$

FIG. 7 is a timing diagram describing a waveform of an essential part of the frequency lock detector of FIG. 3 to which the clock number difference detector of FIG. 6 is applied.

The first logic unit 324 can be expressed as an equation 4 below. When m−n=±K, the first logic unit 324 outputs 0 as the result value d and, when the absolute value of m−n is smaller than K, the first logic unit 324 outputs a value other than 0. Herein, when the counter signal m is 10 and the clock number difference signal d is not 0, the lock signal of the frequency lock detector becomes 1. As illustrated in FIG. 7, when m=10, a≠b and, thus, d is not 0, the lock signal is 1. The reset signal is generated only when the counter signal m is 10 or when the clock number difference signal d is 0 before the counter signal m becomes 10. That is, when m=10, the counter 310 is reset to perform counting from 1 again. If the clock number difference signal d is 0 before the counter signal m is 10, it signifies that the frequency difference between the two signals is out of the desired frequency accuracy even though the counter 310 does not count up to 10. Therefore, the counter 310 is reset to perform the counting from 1 again.

$$d=a-b \equiv K+m-n (\mod 2K) \qquad \text{Eq. 4}$$

FIG. 8, which is a schematic diagram illustrating the clock number difference detector of FIG. 3 in accordance with another embodiment of the present invention, shows the clock number difference detector detecting the difference between the clock number of the reference clock and the clock number of the recovered clock by using a circular shift register.

As illustrated in FIG. 8, the clock number difference detector 320 includes 2K set/reset flipflops 325 to 328, 4K AND gates, and a second logic unit 329, it is embodied in the form of the circular shift register.

Herein, the clock number difference detector 320 receives the reset signal from the lock determiner 330 in the frequency lock detector, initializes K set/reset flipflops among the 2K set/reset flipflops 325 to 328 into 1, and initializes the other K set/reset flipflops into 0. The clock number difference detector 320 is synchronized with the rising edge of the reference clock to thereby increase the number of set/reset flipflops of 1 by one to the right and it is synchronized with the rising edge of the recovered clock signal to thereby increase the number of set/reset flip-flops of 0 by one to the right. Therefore, if the frequency of the reference clock signal is higher than that of the recovered clock signal, the number of set/reset flipflops of 1 is increased among the result values of the set/reset flip-flops and, if the frequency of the reference clock signal is lower, the number of set/reset flipflops of 0 is increased.

The second logic unit 324 is operated as shown in an equation 5. Accordingly, if the difference between the clock number of the reference clock signal and the clock number of the recovered clock signal is K, the result value d becomes 1 or, if the difference is smaller than K, the result value d is 0. Herein, the counter 310 of the frequency lock detector counts N times and the result value d of the second logic unit 324 is 0, the lock determiner 330 outputs '1' as a lock signal. On the contrary, if the result value of the second logic unit 324 is 1 before or when the counter 310 counts N times, the lock determiner 330 outputs '0' as a lock signal and outputs '1' as a reset signal.

$$d=Q_1 Q_2 \ldots Q_{2K} + \overline{Q}_1 \overline{Q}_2 \ldots \overline{Q}_{2K} \qquad \text{Eq. 5}$$

FIG. 9 is a timing diagram describing a waveform of an essential part of the frequency lock detector of FIG. 3 to which the clock number difference detector of FIG. 8 is applied.

To take an example, when 2K=6, the output values of the respective set/reset flipflops 325 to 328 are $Q_1, Q_2, \ldots, Q_6$. The output values $Q_1, Q_2$ and $Q_3$ have 1 as an initial value and the output values $Q_4, Q_5$ and $Q_6$ have 0 as an initial value. This shows that one of the set/reset flipflops having a result value of 1 after synchronization with the recovered clock outputs a result value '0,' and one of the set/reset flip-flops having a result value of 0 after synchronization with the reference clock outputs a result value '1.' Herein, when the counter 310 of the frequency lock detector counts 10 times, the result values of the 2K, i.e., 6, set/reset flipflops are 0, 1, 1, 1, 1, 1. Since the result value d of the second logic unit 329 is 0, the lock signal outputted from the lock determiner 330 becomes 1.

As described above, the present invention embodies a frequency lock detector that can be easily integrated by comparing the frequencies of two clock signals, which are not synchronous to each other, with use of one counter and a clock number difference detector and determining a frequency lock, that is, determining whether the difference between the frequencies is within a desired frequency accuracy.

Differently from a conventional technology using two counters having an increasing complexity according to the counting number N when the desired frequency accuracy is very high, the frequency lock detector of the present invention is embodied to have one counter and a clock number difference detector for detecting the clock number difference that does not increase according to the counting number N. Therefore, even if the desired frequency accuracy is very high, only the complexity of the counter is increased. Therefore, the frequency lock detector of the present invention can be embodied to be a half as large and complex as that of the conventional technology and consume a half as much power as that of the conventional technology. Accordingly, it can be easily integrated.

The present application contains subject matter related to Korean patent application No. 2004-0085772, filed in the Korean Intellectual Property Office on Oct. 26, 2004, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. A frequency lock detector, comprising:
a counter for counting the number of clocks of a reference clock signal inputted from outside;
a clock number difference detector for detecting a difference between the clock number of the reference clock signal and the clock number of a recovered clock signal whose phase is not synchronous to the phase of the reference clock signal; and
a lock determiner for determining a frequency lock based on result values of the counter and the clock number difference detector;
wherein the lock determiner receives a result value m from the counter and a result value d from the clock number difference detector; when the result value m from the counter is a predetermined counting number N generating and outputting a reset signal to the counter and the clock number difference detector, and when the result value m from the counter is less than the predetermined counting number N and the clock number difference d is larger than a predetermined value corresponding to a desired frequency accuracy generating and outputting a reset signal to the counter and the clock number difference detector; compares the clock number difference d between the reference clock signal and the recovered clock signal with the predetermined value corresponding to the desired frequency accuracy; determines whether the difference between the frequencies of the reference clock signal and the recovered clock signal is within the desired frequency accuracy; and outputs a lock signal based on the determination.

2. The frequency lock detector as recited in claim 1, wherein the clock number difference detector detects the difference between the clock number of the reference clock signal and the clock number of the recovered clock signal by increasing the clock number of the reference clock signal by 1 and decreasing the clock number of the recovered clock signal by 1, outputs a result value d to the lock determiner, and be reset upon a reset signal generated in the lock determiner.

3. The frequency lock detector as recited in claim 1, wherein the clock number difference detector includes a K up/down counter for receiving the reference clock signal from outside through an up terminal, receiving the recovered clock signal through a down terminal, and counting from 0 to ±K, K being a predetermined natural number.

4. The frequency lock detector as recited in claim 1, wherein the clock number difference detector detects a difference between the clock number of the reference clock signal and the clock number of the recovered clock signal by using a circular shift register.

5. The frequency lock detector as recited in claim 4, wherein the clock number difference detector includes 2K set/reset flipflops, 4K AND gates, and a logic unit, and the clock number difference detector is embodied in a form of a circular shift register.

6. The frequency lock detector as recited in claim 5, wherein the clock number difference detector receives a reset signal from the lock determiner and initializes K set/reset fiipftops into 1 among the 2K set/reset flipflops and the other K set/reset flipflops into 0; increases the number of set/reset flipflops of 1 by one to the right by being synchronized with a rising edge of the reference clock signal and increases the number of set/reset flipflops of 0 by one to the right by being synchronized with a rising edge of the recovered clock signal; and, with the logic unit operating as $d = Q_1 Q_2 K Q_{2K} + \overline{Q_1} \overline{Q_2} K \overline{Q_{2K}}$, the clock number difference detector outputs '1' as a result value d when the difference between the clock number of the reference clock signal and the clock number of the recovered clock signal is K and outputs '0' as the result value d when the difference between the clock number of the reference clock signal and the clock number of the recovered clock signal is smaller than K.

7. A frequency lock detector comprising:
a counter for counting the number of clocks of a reference clock signal inputted from outside;
a clock number difference detector for detecting a difference between the clock number of the reference clock signal and the clock number of a recovered clock signal whose phase is not synchronous to the phase of the reference clock signal; and
a lock determiner for determining a frequency lock based on result values of the counter and the clock number difference detector;

wherein the clock number difference detector includes:

a first 2K counter for counting the clock number of the reference clock signal inputted from the outside from K to 2K, K being a predetermined clock number difference that is a natural number, re-counting the clock number of the reference clock signal from 1 to K, and outputting a result value a;

a second 2K counter for counting the clock number of the recovered clock signal from 1 to 2K and outputting a result value b; and a logic unit for detecting a difference between the result values a and b of the first and second 2K counters and outputting the difference to the lock determiner.

* * * * *

UNITED STATES PATENT AND TRADEMARK OFFICE
CERTIFICATE OF CORRECTION

PATENT NO. : 7,643,598 B2  Page 1 of 1
APPLICATION NO. : 11/204957
DATED : January 5, 2010
INVENTOR(S) : Byun et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1067 days.

Signed and Sealed this

Twenty-first Day of December, 2010

David J. Kappos
*Director of the United States Patent and Trademark Office*